(12) United States Patent
Yanasak

(10) Patent No.: US 8,169,216 B2
(45) Date of Patent: May 1, 2012

(54) SYSTEM AND METHOD FOR SYNTHESIZING CROSSING ADC DISTRIBUTIONS VIA REASSEMBLY OF MULTIPLE K-SPACES

(75) Inventor: Nathan E. Yanasak, Crawfordville, GA (US)

(73) Assignee: Medical College of Georgia Research Institute, Inc., Augusta, GA (US)

(*) Notice: Subject to any disclaimer, the term of this patent is extended or adjusted under 35 U.S.C. 154(b) by 345 days.

(21) Appl. No.: 12/387,697

(22) Filed: May 5, 2009

(65) Prior Publication Data

US 2009/0267603 A1 Oct. 29, 2009

Related U.S. Application Data

(63) Continuation-in-part of application No. 12/220,172, filed on Jul. 21, 2008, and a continuation-in-part of application No. 12/321,198, filed on Jan. 15, 2009, now Pat. No. 7,994,784, and a continuation-in-part of application No. 12/321,340, filed on Jan. 15, 2009, said application No. 12/321,198 is a continuation-in-part of application No. 12/220,172, filed on Jul. 21, 2008, said application No. 12/321,340 is a continuation-in-part of application No. 12/220,172, filed on Jul. 21, 2008.

(60) Provisional application No. 61/126,458, filed on May 5, 2008, provisional application No. 60/961,458, filed on Jul. 20, 2007, provisional application No. 61/011,165, filed on Jan. 16, 2008, provisional application No. 61/011,166, filed on Jan. 16, 2008.

(51) Int. Cl.
*G01V 3/00* (2006.01)

(52) U.S. Cl. ...................................................... 324/307
(58) Field of Classification Search ........... 324/300–322
See application file for complete search history.

(56) References Cited

U.S. PATENT DOCUMENTS

| | | | |
|---|---|---|---|
| 5,969,524 A | 10/1999 | Pierpaoli et al. | |
| 6,288,540 B1 | 9/2001 | Chen | |
| 6,549,803 B1 | 4/2003 | Raghavan et al. | |
| 6,591,004 B1 | 7/2003 | VanEssen et al. | |
| 6,686,736 B2 | 2/2004 | Schoen et al. | |
| 6,815,952 B1 | 11/2004 | Rose et al. | |
| 6,845,342 B1 | 1/2005 | Basser et al. | |
| 6,969,991 B2 * | 11/2005 | Bammer et al. | 324/307 |
| 6,972,565 B2 | 12/2005 | Yokoi et al. | |

(Continued)

OTHER PUBLICATIONS

Sundgren, Dong, Gomez-Hassan, Mukherji, Maly, Welsh, Diffusion tensor imaging of the brain: review of clinical applications, 2004, pp. 339-350, vol. 46, Neuroradiology.

(Continued)

*Primary Examiner* — Dixomara Vargas
(74) *Attorney, Agent, or Firm* — Gardner Groff Greenwald & Villanueva

(57) ABSTRACT

A method for synthesizing crossing ADC distributions via reassembly of multiple k-spaces is disclosed. The method includes the steps of scanning a test object having a plurality of anisotropic structures to acquire a first set of DTI data using gradient directions; rotating the gradient directions by an angle α; repeating the step of scanning the test object to acquire a second set of DTI data; creating a composite data set from the first and second sets of data; and applying an inverse Fourier transform to the composite data set.

21 Claims, 6 Drawing Sheets
(2 of 6 Drawing Sheet(s) Filed in Color)

U.S. PATENT DOCUMENTS

| | | | |
|---|---|---|---|
| 6,992,484 B2* | 1/2006 | Frank | 324/307 |
| 7,330,026 B2 | 2/2008 | Wang et al. | |
| 7,346,382 B2 | 3/2008 | McIntyre et al. | |
| 7,355,403 B2 | 4/2008 | Chakraborty | |
| 7,408,345 B2 | 8/2008 | Bammer et al. | |
| 7,409,035 B2 | 8/2008 | Kaufman et al. | |
| 7,411,393 B2 | 8/2008 | Zhang | |
| 7,529,422 B2 | 5/2009 | Wang et al. | |
| 7,570,049 B2 | 8/2009 | Lange | |
| 7,643,863 B2* | 1/2010 | Basser et al. | 600/410 |
| 7,660,481 B2 | 2/2010 | Schaap et al. | |
| 7,775,980 B2 | 8/2010 | Sumi | |
| 7,834,627 B2 | 11/2010 | Sakai et al. | |
| 2009/0058417 A1 | 3/2009 | Yanasak et al. | |
| 2009/0190817 A1 | 7/2009 | Yanasak et al. | |
| 2011/0074423 A1* | 3/2011 | Krzyzak | 324/318 |

OTHER PUBLICATIONS

Taouli, Martin, Qayyum, Merrimand, Vigernon, Yeh, Coakley, Parallel Imaging and Diffusion Tensor Imaging for Diffusion-Weighted MRI of the Liver: Preliminary Experience in Healthy Volunteers, American Journal of Neuroradiology, 2004, p. 677, vol. 183.

Thoeny, Dekeyzer, Oyen, Peeters, Diffusion-weighted MR Imaging of Kidneys in Healthy Volunteers and Patients with Parenchymal Diseases: Initial Experience, Raidology, 2005, pp. 911, vol. 235.

Tuch et al., Diffusion MRI of Complex Neural Architecture, Neuron, 2003, pp. 885-895, vol. 40.

Tuch, Reese, Wiegell, Makris, Belliveau, Wedeen, High Angular Resolution Diffusion Imaging Reveals Intravoxel White Matter Fiber Heterogeneity, Magnetic Resonance in Medicine, 2022, p. 577, vol. 48.

Von Dem Hagen, Henkelman, Orientational Diffusion Reflects Fiber Structure Within a Voxel, Magn. Reson. Med., 2002, p. 454, vol. 48.

Yanasak, Allison, Use of capillaries in the construction of an MRI phantom for assessment of diffusion tensor imaging: demonstration of performance, 2006, pp. 1349-1361, vol. 24, Magn Reson Imaging.

Zhuang J. et al., Correction of Eddy-Current Distortions in Diffusion Tensor Images Using the Known Directions and Strengths of Diffusion Gradients, J Magn Reson Imag., 2004, pp. 1263-1270, vol. 24.

Zou, Warfield, Bharatha, Tempany, Kaus, Haker, Wells, Jelesz, Kikinis, Statistical Validation of Image Segmentation Quality Based on a Spatial Overlap Index; Academic Radiology, 2004, p. 178, vol. 11.

Schott North America, Inc.; Components Enabling Biotechnology Research; www.us.schott.com; 2 pages; printed Feb. 11, 2011.

Alexander, Hasan, Lazar, Tsuruda, Parker, Analysis of Partial Volume Effects in Diffusion-Tensor MRI, Magnetic Resonance in Medicine, 2001, p. 770, vol. 45.

Anderson, Theoretical analysis of the effects of noise on diffusion tensor imaging, 2001, pp. 1174-1188, vol. 46, Magn Reson Med.

Ardekani, Selva, Sayer, Sinha, Quantitative Metrics for Evaluating Parallel Acquisition Techniques in Diffusion Tensor Imaging at 3 Tesla, Investigative Radiology, 2006, p. 806, vol. 41.

Assaf, Freidlin, Rohde, Basser, New Modeling and Experimental Framework to Characterize Hindered and Restricted Water Diffusion in Brain White Matter, Magnetic Resonance in Medicine, 2004, p. 965, vol. 52.

Bammer, Auer, Keeling, Augustin, Stables, Prokesch, et al., Diffusion tensor imaging using single-shot SENSE-EPI, 2002, pp. 128-136, vol. 48, Magn Reson Med.

Basser, Mattiello, Le Bihan, MR diffusion tensor spectroscopy and imaging, 1994, pp. 259-267, vol. 68, Biophys J.

Basser, Pajevic, Statistical artifacts in diffusion tensor MRI (DT-MRI) caused by background noise, 2000, pp. 41-50, vol. 44, Magn Reson Med.

Basser, Pierpaoli, Microstructural and physiological features of tissues elecidated by quantitative-diffusion-MRI tenso, 1996, pp. 209-219, vol. B111.

Bastin, Armitage, Marshall, A theoretical study of the effect of experimental noise on the measurement of anisotropy in diffusion imaging, 1998, pp. 773-785, Magn Reson Imaging.

Beaulieu, The basis of anisotropic water diffusion in the nervous system—a technical review, 2002, pp. 435-455, vol. 15, NMR Biomed.

Caan, De Vries, Khedoe, Akkerman, Van Vliet, Grimberger, Vos, Generating fiber crossing phantoms out of experimental DWIs, in Proceedings of the 2007 Medical Image Computing and Computer-Assisted Intervention (MICCAI) Conference, 2007.

Chang, Koay, Pierpaoli, Basser, Variance of estimated DTI-derived parameters via first-order perturbation methods, 2007, pp. 141-149, vol. 57, Magn Reson Med.

Chen, Hsu, Noise removal in magnetic resonance diffusion tensor imaging, 2005, pp. 393-407, vol. 54, Magn Reson Med.

Chen. B et al, Correction for direction-dependent distortions in diffusion tensor imaging using matched magnetic field maps, NeuroImage, 2006, pp. 121-129, vol. 30.

Chung, Lu, Henry, Comparison of bootstrap approaches for estimation of uncertainties of DTI parameters, 2006, pp. 531-541, vol. 33, Neuroimage.

Cook, Bai, Hall, Nedjati-Gilani, Seunarine, Alexandcer, Camino: Diffusion MRI reconstruction and processing, Cetre for Medical Image Computing, Department of Computer Science, University College London, UK.

Cook, Bai, Nedjati-Bilani, Seunarine, Hall, Parker, Alexander, Camino: Open-Source Diffusion—MRI Reconstruction and Processing, in Proceedings of the 14th Scientific Meeting of the ISMRM (2006), p. 2759, abstract #.

Dice, Measure of the Amount of Ecologic Association Between Species, Ecology, 1945, p. 297, vol. 25.

Dietrich, Heiland, Sartor, Noise correction for the exact determination of apparent diffustion coefficient at low SNR, 20001, pp. 448-453, vol. 45, Magn Reson Med.

Ding, Gore, Anderson, Reduction of noise in diffusion tensor images using anisotropic smoothing, 2005, pp. 485-490, vol. 53, Magn Reson Med.

Facon, Ozanne, Fillard, Tournoux-Facon, MR Diffusion Tensor Imaging and Fiber Tracking in Spinal Cord Compression, American Journal of Neuroradiology, 2007, p. 411, vol. 28.

Fieremans, Deene, Delputte, Ozeemir, Achten, Lemahieu, The design of anisotropic diffusion phantoms for the validation of diffusion weighted magnetic resonance imaging, 2008, vol. 53.

Griswold, Jakob, Heidemann, Nittka, Jellus, Wang, Kiefer, Hasse, Generalized Autocalibrating Partially Parallel Acquisitions (GRAPPA), Magnetic Resonance in Medicine, 2002, p. 1201, vol. 47.

Gudbjartsson, Patz, The Rician distribution of noisy MRI data, 1995, pp. 910-914, vol. 34, Magn Reson Med.

Hagemen et al., A Diffusion Tensor Imaging Tractography Algorithm Based on Navier-Stokes Fluid Mechanics, 3rd IEEE international symposium on biomedical imaging: macro to nano, 2006, pp. 798-801.

Hagmann, DTI mapping of human brain connectivity: statistical fire tracking and virtual dissection, 2003, pp. 545-554, vol. 19, Neuroimage.

Hasan, Parker, Alexander, Magnetic Resonance Water Self-Diffusion Tensor Encoding Optimization Methods for Full Brain Acquisition, Image Analysis and Stereology, 2002, p. 87, vol. 21.

Horsfield, Jones, Applications of diffusion-weighted and diffusion tensor MRI to white matter diseases: a review, 2002, p. 570-577, vol. 15, NMR Biomed.

Horsfield, Using diffusion-weighted MRI in multicenter clinical trials for multiple sclerosis, 2001, pp. S51-S54, vol. 186, J Neurol.

Jellison, Field, Medow, Lazar, Salamat, Alexander, Diffusion Tensor Imaging of Cerebral White Matter: A Pictorial Review of Physics, Fiber Tract Anatomy, and Tumor Imaging Patterns, American Journal of Neuroradiology, 2004, pp. 356, vol. 25.

Jenkinson, A fast, automated, n-dimensional phase unwrapping algorith, Magnetic Resonance in Medicine, 2003, pp. 193-197, vol. 49.

Jones, Basser, "Squashing peanuts and smashing pumpkins": how noise distorts diffusion-weighted MR data, 2004, pp. 979-993, vol. 52, Magn Reson Med.

Koay, Chang, Carew, Pierpaoli, Basser, A unifying theoretical and algorithmic framework for least squares methods of estimation in diffusion tensor imaging, Journal of Magnetic Resonance, 2006, p. 115, vol. 182.

Landman, Farrell, Jones, Smith, Prince, Mori, Effects of diffusion weighting schemes on the reporucibility of DTI-derived fractional anisotropy, mean diffusivity, and principal eigenvector measurements 1.5T, NeuroImage, 2007, p. 1123, vol. 36.

Le Bihan, Breton, Lallemand, Grenier, Cabanis, Laval-Jeanet, MR imaging of intravoxel incoherent motions: application to diffusion and perfusion in neurologic disorders. 1986, pp. 401-407, vol. 161, Radiology.

Le Bihan, Mangin, Poupon, Calrk, Pappata, Molkko, et al., Diffusion tensor imaging: concepts and applications, 2001, pp. 534-546, vol. 13, J Magn Reson Imaging.

Lin, Validation of Diffusion Tensor Magnetic Resonance Axonal Fiber Imaging with Registered Manganes-Enhanced Optic Tracts, NeuroImage, 2001, p. 1035, vol. 14.

Mori, Frederiksen, Van Zijl, Stieltjes, Kraut, Solaiyappan, et al., Brain white matter anatomy of tumor patients evaluated with diffusion tensor imaging, 2002, pp. 377-380, vol. 51, Ann Neurol.

Pagani, Bammer, Horsfiel, Rovaris, Gass, Ciccarelli, Filippi, Diffusion MR Imaging in Mulltiple Sclerosis: Technical Aspects and Challenges, American Journal of Neuroradiology, 2007, pp. 411, vol. 28.

Panin et al., Diffusion tensor MR imaging of principal directions: a tensor tomography approach, Phys Med Biol, 2002, pp. 2737-2757, vol. 47.

Parker, Schnabel, Symms, Wehring, Barker, Nonlinear smoothing for reduction of systematic and random errors in diffusion tensor imaging, 2000, pp. 702-710, vol. 11, J Magn Reson Imaging.

Peled et al., Geometrically constrained two-tensor model for crossing tracts in DWI, Mag Reson Imaging, 2004, pp. 1263-1270, vol. 24.

Pierpaoli, Basser, Toward a quantitative assessment of diffusion anisotropy, 1996, pp. 893-906, vol. 36, Magn Reson Med.

Poupon, Perrin, Rieul, Mangin, Bihan, Validation of Q-Ball imaging with a diffusion fiber crossing phantom on a clinical scanner, poster presentation at the ISMRM Workshop on Methods for Quantitative Diffusion MRI of Human Brain, 2005.

Poupon, Rieul, Kezele, Perrin, Poupon, Mangin, New diffusion phantoms dedicated to the study and validation of high-angular resolution diffusion imaging (hardi) models, 2005, Magnetic Resonance in Medicine, vol. 60.

Pruessmann, Weiger, Scheidegger, Boesing, SENSE: sensitivy encoding for fast MRI, pp. 952-962, vol. 42, Magn Reson Med, 1999.

Schluter et al., White Matter Lesion Phantom for Diffusion Tensor Data and its Application to the Assessment of Fiber Tracking, Proc SPIE—The Intl Soc for Optical Engg., 2005, pp. 835-844, vol. 5746.

Skare, Li, Nordell, Ingvar, Noise considerations in the determination of diffusion tensor anistropy, 2000, p. 659-669, vol. 18, Magn Reson Imaging.

Stejskal, Tanner, Spin Diffusion Measurements, Journal of Chemical Physiscs, 1965, p. 488, vol. 41.

Sullivan, Pfefferbaum, Diffusion tensor imaging in normal aging and neuropsychiatric disorder, 2003, p. 244-255, vol. 45, Eur J Radiol.

* cited by examiner

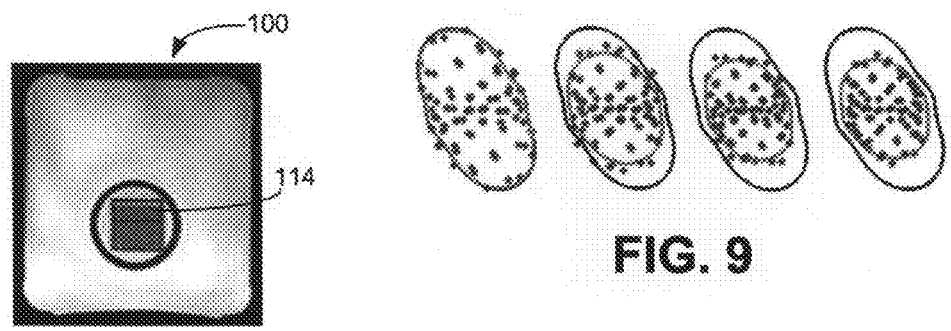
FIG. 3
FIG. 9
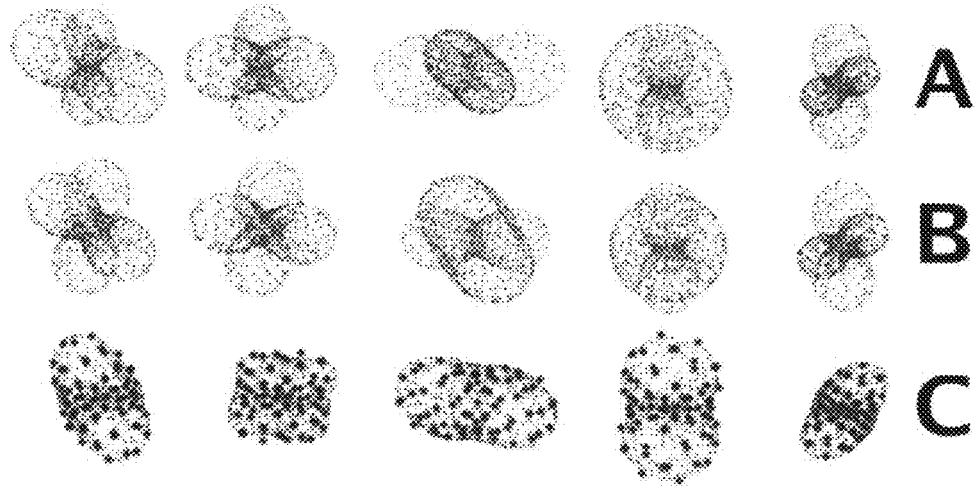
FIG. 8

SYSTEM AND METHOD FOR SYNTHESIZING CROSSING ADC DISTRIBUTIONS VIA REASSEMBLY OF MULTIPLE K-SPACES

CROSS-REFERENCE TO RELATED APPLICATIONS

This application is a continuation-in-part of U.S. patent application Ser. No. 12/220,172 filed on Jul. 21, 2008, which claims the benefit of the filing date of U.S. Provisional Patent Application Ser. Nos. 60/961,458 filed on Jul. 20, 2007; 61/126,458 filed on May 5, 2008; 61/011,165 filed on Jan. 16, 2008; and 61/011,166 filed on Jan. 16, 2008. This application is also a continuation-part of U.S. patent application Ser. Nos. 12/321,198 and 12/321,340 filed Jan. 15, 2009, each of which is a continuation-in-part of Ser. No. 12/220,172 and each of which claims the benefit of the filing date of U.S. Provisional Patent Application Ser. Nos. 61/126,458 filed on May 5, 2008; 61/011,165 filed on Jan. 16, 2008; and 61/011,166 filed on Jan. 16, 2008. This application further claims the benefit of U.S. Provisional Patent Application Ser. No. 61/126,458, filed May 5, 2008. The disclosures of all of these applications are incorporated herein by reference in their entireties.

TECHNICAL FIELD

The present invention relates generally to the field of medical imaging, and more particularly to a system and method for synthesizing crossing apparent diffusion coefficient ("ADC") distributions via reassembly of multiple k-spaces.

BACKGROUND OF THE INVENTION

Diffusion tensor imaging (DTI) is an MRI-based technique with great potential to enhance clinical diagnosis of pathology in structured tissue. In particular, DTI has shown promise in the area of neurological disease, exhibiting some sensitivity to identifying white-matter tumor extent, sclerotic lesions, and compression trauma in the spine. In clinical research, DTI has been used to map white matter fiber trajectories in the brain. Other pathology that may be favorably characterized with DTI includes liver and renal diseases, and potentially other tissues and conditions.

Despite its utility, the routine diagnostic application of DTI remains in its infancy. Reasons for this include that, considering the large amount of information that DTI provides as compared to an ordinary MR sequence, the clinical adoption of standardized protocols is lagging. During a DTI sequence, a series of images are generated by applying gradient magnetic fields along particular directions, to measure the directional dependence of diffusion. DTI reduces this series of measurements to a tensor at every image location, with each eigenvalue (sometimes referred to as "e-value") and eigenvector representing the apparent diffusion coefficient (ADC) values along principle axes of an ellipsoid. Precision of the measurements depends on the number of directions sampled and the choice of particular direction schemes. Furthermore, DTI measurements characterize tissue properties indirectly, including cellular size, orientation, heterogeneity, and cell permeability. Uncertainty persists in the understanding of how DTI measures correlate with these tissue characteristics and how they change with disease.

Procedures for quality assurance (QA) and for estimation/measurement of systematic uncertainty have yet to be developed for DTI. In comparison with a single intensity value per voxel measured using a T1-weighted MR sequence, the end-product of a DTI series is six values to define a tensor within a given reference frame, where the frame is defined by three orthogonal vectors. As expected, the effect of noise on DTI data is more complicated than for routine clinical images, leading to a systematic bias that depends on SNR (signal to noise ratio). In an effort to eliminate image distortion inherent to the echo-planar imaging sequences predominantly used in the clinic and to migrate to higher-resolution imaging, parallel imaging has been incorporated with DTI. Unfortunately, while the array coils necessary for parallel MR scanning systems show improved SNR overall, their use changes the spatial properties of the noise distribution over the image. This effect of non-uniformity in the spatial sensitivity of surface coils is enhanced further using parallel imaging, leading to regions where noise may be higher or have variable spatial correlation, decreasing sensitivity within these regions.

One known technique for DTI data synthesis involves mixing signals from different parts of magnitude images (i.e., non-complex data such as a grayscale image with pixel values from 0 to some maximum value) to provide ground truth for tractography algorithms.

SUMMARY OF THE INVENTION

In example embodiments, the present invention provides a system and method for monitoring the effect of certain systematic biases on DTI data exhibiting complicated diffusion geometries. Actual data is acquired instead of simulated, increasing the direct clinical relevance, as no assumptions need to be made about scanner performance. Using apparent diffusion coefficient (ADC) measurements of a simple capillary structure, data characteristic of more complicated diffusive behavior are "synthesized," or composed of actual measurements that undergo transformation into a desired spatial distribution function describing ADC.

To synthesize a two-tensor ADC distribution, one can take advantage of the conjugate symmetry of k-space. MR data can be acquired in such a manner that the data is sorted in a volume of "k-space," which is a mathematical space that represents an image as a set of simple 2D or 3D Fourier components. By applying diffusion gradients in one set of directions then rotating the gradient coordinate frame by an angle and applying another set of diffusion gradients, one acquires a set of pairs of complex data where each member differs in its diffusion weighting. If k-space were divided in half for these pairs (i.e., removal of conjugate complex component), and two halves containing different diffusion weightings were recombined into a composite k-space, the image after transformation of the composite would reflect an average of the information in both images. Considering the whole set of image pairs, the recombination of data in k-space will synthesize a distribution that is equivalent to volume-averaging of two diffusion distributions. The noise in the resultant dataset would nominally possess similar characteristics as the original sets. The angle at which the tensor components cross is adjustable via the rotation angle between the first and second coordinate frame of the applied gradients.

In one aspect, the present invention comprises a method for synthesizing crossing ADC distributions via reassembly of multiple k-spaces in an MRI system. The method includes the steps of scanning a test object having a plurality of anisotropic structures to acquire a first set of DTI data using a plurality of gradient directions; rotating the gradient directions by an angle $\alpha$; repeating the step of scanning the test object to acquire a second set of DTI data; creating a composite data set from the first and second sets of data; and applying an inverse Fourier transform to the composite data set to generate a mean image. Preferably, the step of creating a composite data set includes combining half of the data from each data set, wherein the half of the data of each set comprises data with conjugate complex components removed. The method can further include the steps of performing an inverse Fourier transform to generate the spin density of each set of data; applying an appropriate phase shift to each set of data; and transforming each set of data back to k-space before creating the composite data set.

In another aspect, the present invention comprises a computer-readable medium storing instructions that, when executed on a programmed processor, carry out a method for synthesizing crossing ADC distributions via reassembly of multiple k-spaces in an MRI system. The computer-readable medium comprises instructions for scanning a test object having a plurality of anisotropic structures to acquire a first set of DTI data using a plurality of gradient directions; instructions for rotating the gradient directions by an angle α; instructions for repeating the step of scanning the test object to acquire a second set of DTI data; instructions for creating a composite data set from the first and second sets of data by combining half of the data from each data set; and instructions for applying an inverse Fourier transform to the composite data set to generate a mean image.

In still another aspect, the present invention comprises a system for synthesizing crossing ADC distributions via reassembly of multiple k-spaces in an MRI system. The system comprises means for scanning a test object having a plurality of anisotropic structures to acquire a first set of DTI data using a plurality of gradient directions; means for rotating the gradient directions by an angle α; means for repeating the step of scanning the test object to acquire a second set of DTI data; means for creating a composite data set from the first and second sets of data by combining half of the data from each data set; and means for applying an inverse Fourier transform to the composite data set to generate a mean image.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

FIG. 3 depicts an MRI image of the phantom of FIG. 1 and showing a region of interest.

FIG. 8 shows computed ADC spatial profiles after combination of datasets according to the example method of the present invention and theoretical profiles for comparison.

FIG. 9 shows computed ADC spatial profiles after combination of datasets, as a function of mean SNR measured in a region of interest ("ROI") on diffusion-weighted images ("DWI"), according to the example method of the present invention.

DETAILED DESCRIPTION OF EXAMPLE EMBODIMENTS

Figure 1A:
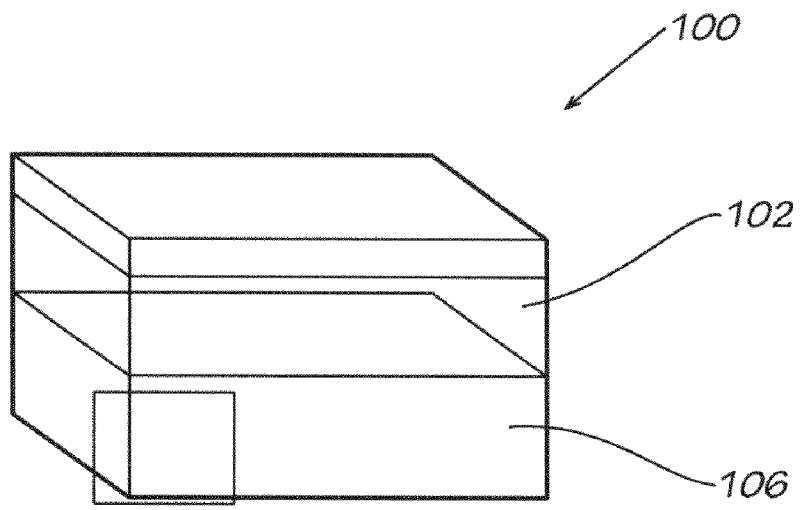
FIGS. 1A and 1B depict a perspective view of a phantom for use with DTI imaging and having a plurality of capillary arrays according to a first example embodiment of the present invention.

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

With reference now to the drawing figures, wherein like reference numbers represent corresponding parts throughout the several views, FIG. 1 depicts a perspective view of a phantom or test object 100 for use with DTI imaging according to a first example embodiment. DTI data can be synthesized using the capillary phantom 100 of the present invention exhibiting prolate (or "cigar"-like) diffusive characteristics under ordinary scanning conditions.

Figure 1B:
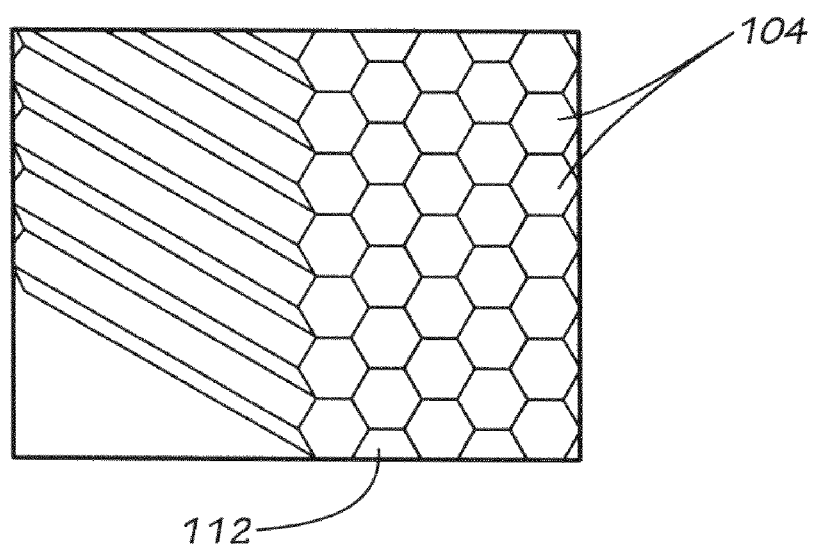

As shown in FIGS. 1A and 1B, in an example embodiment, the phantom 100 includes a housing 102 that contains an assembly of a plurality of capillary arrays 104 therein, with each capillary closely abutting adjacent capillary arrays. Together, the plurality of capillary arrays 104 forms a macro-array 106. Hereafter, any larger-scale assembly of capillary arrays shall be referred to as a "macro-array". As shown, each capillary array 104 is hexagonal in shape. The hexagonal shapes of the capillary arrays 104 within the housing 102 facilitate stacking of the capillary arrays into the macro-array, which as shown in FIG. 1A is generally rectangular in appearance and conforms to the shape of housing 102. Alternatively, the capillary arrays can be any suitable size or shape, such as trapezoidal, triangular, octagonal, rectangular, etc.

Figure 2:
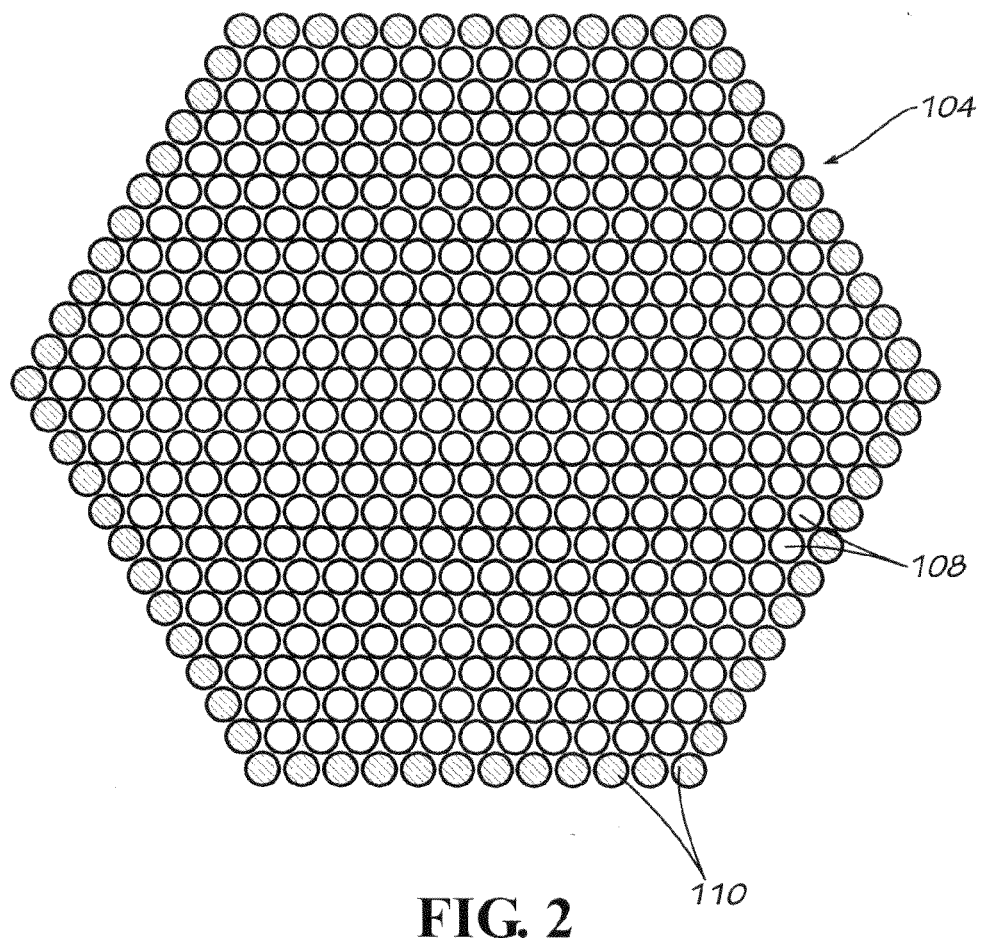
FIG. 2 depicts a sectional view of one capillary array in the phantom of FIG. 1.

Each capillary array 104 of the depicted embodiment includes a plurality of glass capillaries 108 therein, as shown in FIG. 2. In a typical example embodiment, glass capillaries 108 are used because they are generally easier to manufacture with high-precision diameters. Additionally, the formulation of glass can be such that its magnetic susceptibility can be closely matched to that of water. However, those skilled in the art will understand that other suitable materials, such as plastics, can be used for the capillaries 108. In a typical example embodiment, each capillary's internal diameter is between about 10 and 90 microns and more preferably between about 20 and 82 microns. The capillaries 108 are optionally completely filled with water, although in alternative embodiments, the capillaries can be substantially or partially filled with water and/or other material. Optionally, each capillary can include an amount of a suitable contrast dopant. An exemplary capillary array 104 is a hexagonal capillary array having 397 capillaries 108 and 1470 interstitial pores of lesser volume with the whole array bounded by a layer of solid glass rods 110, as manufactured by Schott North America, Inc. (Southbridge, Mass.) and shown in FIG. 2. In the depicted example, the diameter of each glass rod 110 is equal to or substantially equal to the diameter of each capillary 108, and the capillaries 108 and the glass rods 110 are in a close-packed hexagonal arrangement. Those skilled in the art will understand that other suitable capillary arrays of other sizes and shapes can be employed as well.

Referring back to FIG. 1A, the housing 102 can be constructed from any suitable material having a magnetic susceptibility that can be somewhat matched to that of water. Exemplary materials include polypropylene, polyethylene, glass, and PMMA, although those skilled in the art will understand that other suitable materials can be employed as well. In the depicted embodiment, the housing 102 has a substantially box-like shape measuring about one inch by about one inch by about one inch, although such dimensions are exemplary and can vary, and any suitable size and shape of housing can be used. For example in an alternative embodiment, a cylindrical housing with a screw-top lid can be employed.

The plurality of capillary arrays 104 can be bound together into the macro-array 106 with a water absorbent material, such as cotton string (not shown for purposes of clarity). In alternative embodiments, the capillary arrays 104 can be held together with a somewhat of an interference fit (such as a mechanical or pressure fit) if the housing is only slightly larger than the macro-array, thereby providing a mechanical force against the macro-array. Other suitable devices and techniques can be used to secure the capillary arrays 104 together and/or secure the macro-array within the housing so as to prevent the macro-array from moving while the phantom 100 is scanned.

As shown in FIG. 1A, all of the hexagonal capillary arrays 104 are aligned in the same direction and stacked on top of each other in the housing 102. The bottom row of capillary arrays 104 (i.e., the row of capillary arrays at the base of the housing) includes a series of voids 112 (or channels) between adjacent arrays. Similarly (and though not shown in the drawings for purposes of clarity), the top row of arrays 104 (i.e., the row of capillary arrays near the top or lid of the housing) includes a similar series of voids (or channels) between adjacent arrays. Alternatively, the top and bottom rows of arrays can include alternating hexagonal arrays and trapezoidal (i.e., "half-hexagonal") arrays that abut each other so as to create a hexagonal pattern with minimal or no space between adjacent arrays or between the arrays and the base of the housing. In another alternative form, instead of hexagonal arrays, all of the arrays can be trapezoidal, thereby providing an arrangement without the voids of FIG. 1A.

In a typical example embodiment, there are generally enough capillary arrays 104 to fill or substantially fill the housing 102. A sufficient amount of water (such as distilled water) is placed inside of the housing and hence fills any voids between the arrays and between the arrays and the housing. In alternative embodiments, the macroarray of capillary arrays 104 fill only a portion of the housing 102. In such an embodiment, it may be advantageous to place a weight, such as a water-saturated piece of material (such as cotton) or fabric, on the macro-array 106 so as to keep the capillary arrays 104 in a tightly stacked configuration. However, when hexagonal or trapezoidal capillary arrays 104 are used, there is a natural tendency for the macro-arrays to stack in a tight configuration in shape.

As depicted, the phantom 100 has a volume of about 125 in$^3$, comprising in part of arrays of water-filled 20 μm i.d. capillaries. The dimensions of the assembly of capillary arrays were approximately 1×1×0.3 in$^3$. A region of interest 114 of the phantom 100 is shown in the MRI image of FIG. 3. Additional phantoms are described in U.S. Patent Publication No. 2009/0058417, filed Jul. 21, 2008, for "Test Object for Use with Diffusion MRI and System and Method of Synthesizing Complex Diffusive Geometries Using Novel Gradient Directions" and owned by the assignee of the present application. Any of the phantoms described in U.S. Patent Publication No. 2009/0058417 can be used with the present invention.

Figure 4:
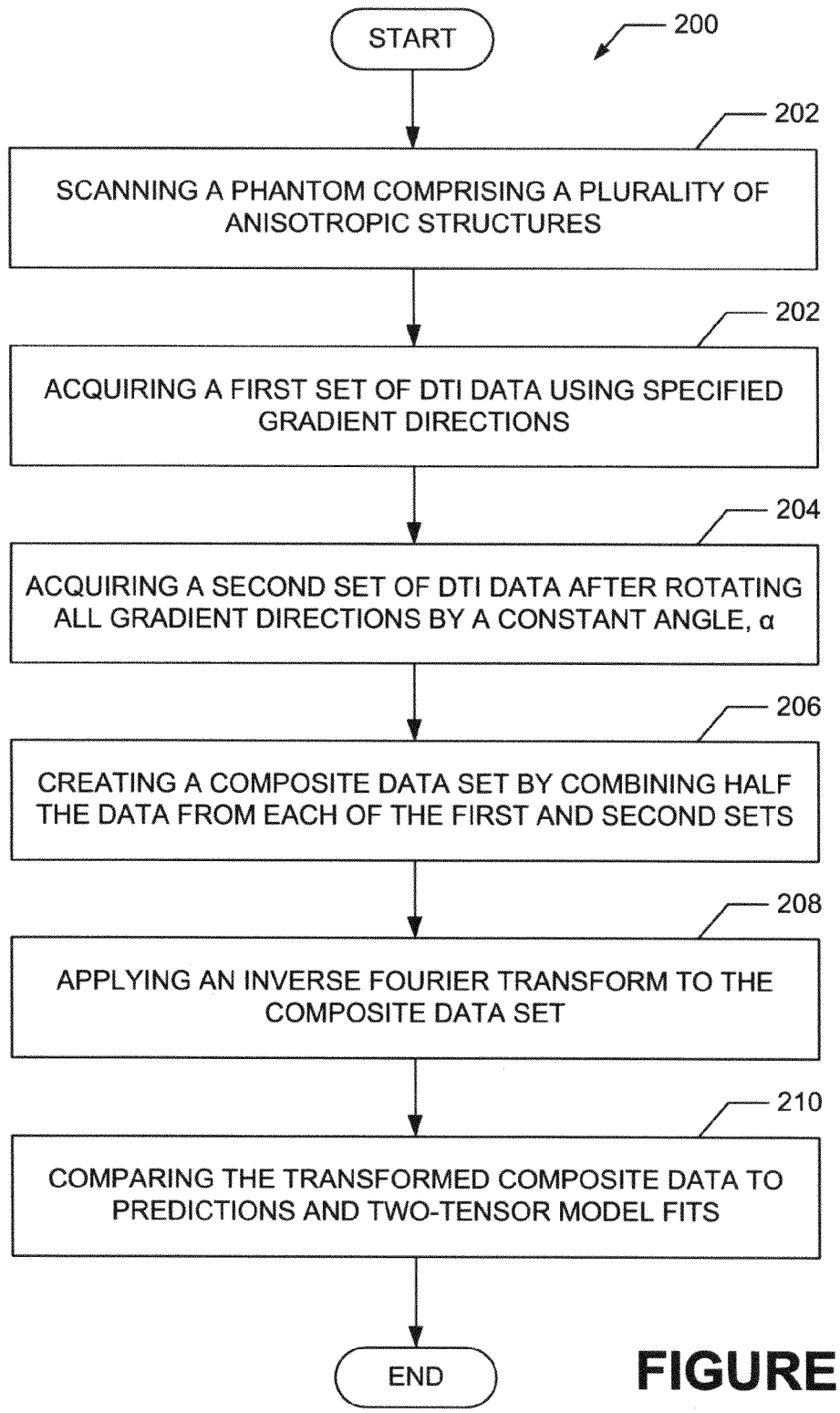
FIG. 4 depicts a flow diagram of a method for synthesizing crossing ADC distributions via reassembly of multiple k-spaces using the phantom of FIG. 1 according to an example embodiment of the present invention.
Figure 5:
FIG. 5 shows the ADC spatial profiles measured in each pixel of the region of interest that was acquired during a normal DTI sequence of the phantom of FIG. 3.
Figure 5:
Figure 5:
Figure 5:
Figure 5:
Figure 5:
Figure 5:
Figure 5:
Figure 5:
Figure 5:
Figure 6:
FIG. 6 shows the ADC spatial profile measured when the gradient frame is rotated by 60° and repeating the DTI sequence of the phantom of FIG. 3.
Figure 7:
FIG. 7 shows the ADC spatial profile after combining the profiles of FIGS. 5 and 6 according to the example method the present invention.

FIG. 4 depicts a flow diagram of a method 200 for synthesizing crossing ADC distributions via reassembly of multiple k-spaces using the phantom. As discussed above, MR data can be acquired in such a manner that the data is sorted in a volume of "k-space," which is a mathematical space that represents an image as a set of simple 2D or 3D Fourier components. The synthesized data represents a 1:1 mixture of two identical diffusion tensor components, which is of relevance in fiber-crossing regions of tissue. To accomplish this, data can be acquired using a set of gradient directions distributed homogeneously over a sphere at step 202, and another set of data can be acquired after rotating all gradient directions by a constant angle, α at step 204. Preferably, the number of gradient directions is greater than or equal 12 and comprise a number that is divisible by 2. In an example embodiment, 72 gradient directions are used. The angle α can be any desired angle between 0° and 90°. Data is shown in FIG. 5 (showing the ADC spatial profiles measured in each pixel of the region of interest that was acquired during a normal DTI sequence of the phantom) and FIG. 6 (showing the ADC spatial profile measured when the gradient frame is rotated by 60° and repeating the DTI sequence of the phantom). Taking one half of the data from both sets before inverse Fourier transform, a composite dataset can be formed by combining the two halves into one k-space at steps 206 and 208, after proper consideration of phase information. The transformed data can result in a DTI dataset with an ADC distribution conforming to a mixture of two tensors crossing at angle α. FIG. 7 shows the ADC spatial profile after combining the profiles of FIGS. 5 and 6. Used in conjunction with the data synthesis technique as described in U.S. Patent Publication No. 2009/0058417, ADC distributions consisting of 1:1 mixtures of non-identical tensors can also produced. After synthesis, distribution characteristics can be compared to predictions and to two-tensor model fits at step 210. After applying an inverse Fourier transform to k-space, the magnitude of the complex transformed data represents an image that can be used in the clinic.

Assuming that two diffusion-weighted images (DWI) have been acquired, where a different diffusion gradient has been applied for each image, the complex signal from each set, $s_q(k=j\Delta k_x, l\Delta k_y)$, can be inversely Fourier transformed to yield a complex spin density function, $I_q(r=x,y)$, which represents a real-valued MRI image, $\mathcal{I}_q$, multiplied by a phase term: $I_q(r) = \mathcal{I}_q(r)e^{i\theta_q(r)}$. The discrete inverse Fourier transform of the composite data set, $I_c$, constructed using two halves of k-space from two different data sets, is given by the following expression:

$$I_c(r) = \sum_{j=-N}^{N+1}\left[\sum_{l<0} s_1(k)e^{i2\pi(xj\Delta k_x + yl\Delta k_y)} + \sum_{l>0} s_2(k)e^{i2\pi(xj\Delta k_x + yl\Delta k_y)}\right] \quad (1)$$

Given two real images $\mathcal{I}_1$ and $\mathcal{I}_2$, each image can be defined relative to a mean image $\overline{\mathcal{I}}$:

$$\mathcal{I}_1 = \overline{\mathcal{I}} - \Delta I; \mathcal{I}_2 = \overline{\mathcal{I}} + \Delta I \quad (2)$$

Equation 1 can be written out more explicitly by replacing $s_q$ with the Fourier transform of $I_q$:

$$I_c(r) = \sum_j \left[\sum_{l<0}\mathcal{F}\{(\overline{\mathcal{I}} + \Delta I)e^{i\theta_1(r)}\}e^{i2\pi(xj\Delta k_x + yl\Delta k_y)} + \sum_{l>0}\mathcal{F}\{(\overline{\mathcal{I}} - \Delta I)e^{i\theta_2(r)}\}e^{i2\pi(xj\Delta k_x + yl\Delta k_y)}\right] \quad (3)$$

If the phases $\theta_1$ and $\theta_2$ are the same, the expression can be simplified significantly:

$$I_c(r) = \overline{\mathcal{I}}(r) + \sum_j e^{i2\pi xj\Delta k_x} \times \left[\sum_{l<0}\mathcal{F}\{\Delta I e^{i\theta_1(r)}\}e^{i2\pi yl\Delta k_y} - \sum_{l>0}\mathcal{F}\{\Delta I e^{i\theta_1(r)}\}e^{i2\pi yl\Delta k_y}\right] \quad (4)$$

If the transform term $\mathcal{F}\{\Delta I e^{i\theta_1(r)}\}$ were purely real, the conjugate properties of k-space would dictate that the sum for $k_y > 0$ (i.e., $l > 0$) would cancel the sum for $k_y < 0$, and the magnitude of $I_c$ would be equal to the mean image $\overline{\mathcal{I}}$. If the image contrast for $\mathcal{I}_1$ and $\mathcal{I}_2$ represented diffusion along two different axes of a prolate distribution, the composite image would represent the volume average of diffusion along both of those axes. To achieve this, the phases after transform of both images $\mathcal{I}_1$ and $\mathcal{I}_2$ should both be approximately zero. Practically, these conditions are violated by inhomogeneity in the bulk MR field and noise. If the phase shifts from field inhomogeneity, $\theta(r)$, are known, the complex data for each half of k-space can be shifted independently to meet this constraint more completely. In practice, one would perform the inverse Fourier transform to generate the complex spin density functions $I_q$, apply the phase shift, transform back to k-space, construct the composite k-space data using each dataset, then perform the inverse Fourier transform again to generate the mean image. To attempt to separate phase differences arising from noise and field inhomogeneity, one can apply smoothing to the phase map before phase-shifting as the phase variations from field are expected to vary smoothly. The noise spectrum in k-space may be altered slightly using this approach, with noise corrupting image components having large spatial wavelengths (i.e., center of k-space) undergoing some degree of modification.

EXAMPLE APPLICATION OF THE INVENTION

A phantom 100 (approximately 125 in$^3$ in volume) comprising arrays of water-filled 20 µm i.d. capillaries was used as the test object. The phantom 100 was scanned with a GE Excite HDx 3.0T MRI scanner (GE Medical Systems, Milwaukee, Wis.), using an eight-channel head coil. DTI data were acquired during two sessions on different days, using a 1- or 2-slice axially-oblique DTI sequence (3 b=0 images collected, with the first image disregarded during processing; two sets of 36 gradient directions per series, or 72 directions total; ASSET factor=1; b=1000 sec mm-2). Before rotation, the set of 36 gradient directions employed were specified by the standard GE MR system file (tensor.dat).

In the first session, data were acquired to demonstrate the proper synthesis of five different distributions: two identical prolates crossing at 90° (hereafter, "90×"); two identical prolates crossing at 60° (hereafter, "60×"); and three other distributions involving 1:1 mixtures of non-identical tensors (hereafter, "compA", "compB", and "compC"), using our the method described in U.S. Patent Publication No. 2009/0058417 to extend the technique in this study. Specific targeted eigenvalues and eigenvectors for the tensor components in these distributions are given in Table 1 in Section 3. Acquisition parameters specific to this session are the following: TR=3 sec; TE=90 msec; FOV=160 mm; slice thickness=4 mm; 1.5 mm gap; Acq. Matrix=128×128. As is generally well known in the art, "TR" is the repetition time (i.e., the amount of time that exists between successive pulse sequences applied to the same slice); "TE" is the echo time (i.e., the time between application of the 90° pulse and the peak of the echo signal in spin echo and recovery pulse sequences); "FOV" is the field of view; "Acq. Matrix" is the acquisition matrix (i.e., the total number of independent data samples in the frequency and phase directions).

In the second scanning session data were acquired to demonstrate the effect of four different SNRs on synthesizing distributions, using the 60× distribution as an example. SNR within the capillaries was calculated using the mean of the DWI images, defined as the ratio of mean image intensity in capillary regions to the standard deviation of intensity outside the phantom. Acquisition parameters for the DTI protocol were altered to adjust SNR (First SNR=12.6, same acquisition parameters as per the first session above; Second SNR=3.9, TR=1 sec, TE=107 msec; FOV=160 mm, slice thickness=2.5 mm; Third SNR=3.5, TR=1 sec, TE=116 msec; FOV=140 mm, slice thickness=2.4 mm; Fourth SNR=3.1, TR=1 sec, TE=121 msec; FOV=130 mm, slice thickness=2.4 mm).

Rectangular ROIs ("regions of interest") of approximately 60 pixels were chosen for analysis on one slice, encompassing approximately ½ of the capillary array assembly but avoiding the boundary. Raw data from each image series was acquired for each of the 72 gradient directions and the 2 b=0 images, where the diffusion-weighted images corresponding to two sets of data having 36 gradient directions. After inverse Fourier transform of the raw data, phase maps were unwrapped in each image using PRELUDE (as is well known and generally described in Jenkinson, M.: A Fast, Automated, N-Dimensional Phase Unwrapping Algorithm. Magnetic Resonance in Medicine 49 (2003) 193-197) and spatially smoothed twice using convolution with a 3×3 smoothing kernel having a two-pixel FWHM (i.e., the effective full width at half maximum of a Gaussian kernel used to smooth the white noise errors in the image data). Images were transformed back to k-space after using phase maps to set phase to zero. Pairs of k-space data differing by a rotation in gradient direction were used to assemble the composite k-space data, before performing an inverse Fourier transform to produce the 36 composite images. Additionally, the two sets of 36 non-composite diffusion-weighted images were assembled from the 72 acquired images in each series, to characterize the unaltered prolate ADC distribution of the phantom. Eigenvalues and eigenvectors for these one-tensor distributions were calculated using a weighted mean square fit.

Spatial ADC distributions were determined for all voxels within the ROI for the composite images. Each distribution was fit using the Camino twoten fitting routine (as is generally well known in the art and as described in Cook, P. A., Bai, Y., Hall, M. G., Nedjati-Gilani, S., Seunarine, K. K., Alexander, D. C.: Camino: Diffusion MRI Reconstruction and Processing. In: IJ 2005 MICCAI Open-Source Workshop. (2005)), assuming that one tensor has cylindrical symmetry and the other is positive definite. For visualization, image intensity was averaged over the ROI for the composite images, and the mean ADC distribution was determined. The root-mean-square differences between ADC measurements and expected ADC values ($\Delta ADC_{RMS}$) were calculated for the mean spatial distributions.

After fitting one tensor to spatially-averaged data in an ROI for the non-composite images, the eigenvalues were given as $(2.1, 0.5, 0.5) \times 10^{-3}$ mm$^2$ sec$^{-1}$. The RMS differences between the ADC measurements and those predicted from the fit tensor were $0.06 \times 10^{-3}$ mm$^2$ sec$^{-1}$. Considering the reliable prolate characteristics of the capillaries of the phantom 100 of FIG. 1, this RMS value can serve as a "best-fit" threshold for agreement between measurements and theory.

FIG. 8 shows computed ADC spatial distributions after combination of datasets. The bottom row (Row C) of FIG. 8 shows a comparison between the measured ADC spatial distributions after synthesis (shown by the blue dots) and the theoretical profile constructed using eigenvalues from non-composite dataset (shown by the red point cloud). For comparison, the middle row (Row B) of FIG. 8 shows the two tensor components used as a target during synthesis (theoretical), and the top row (Row A) FIG. 8 presents the components (red and green) of the two tensor fit. Qualitatively, the fit components are in reasonable agreement with the theoretical components.

TABLE 1

A comparison of DTI metrics for measured and synthesized data.

| | ADC Disrtibutions | | | | |
|---|---|---|---|---|---|
| Quantity | 60× | 90× | compA* | compB | compC |
| | Theoretical: | | | | |
| $(\lambda_1, \lambda_2, \lambda_3)_A$ | (2.2 0.5 0.5) | (2.2 0.5 0.5) | (2.0 0.5 0.4) | (2.0 0.5 0.4) | (2.2 0.5 0.5) |
| $(\lambda_1, \lambda_2, \lambda_3)_B$ | (2.2 0.5 0.5) | (2.2 0.5 0.5) | (2.2 2.2 1.1) | (1.7 1.7 0.4) | (1.5 0.5 0.5) |
| $\theta(\epsilon_A \cdot \epsilon_B)$§ | 60° | 90° | 60° | 90° | 60° |
| <ADC$_i$> | 1.0 | 1.0 | 1.3 | 1.1 | 0.8 |
| $(\Delta ADC_{RMS})$† | 0.05 | 0.10 | 0.15 | 0.05 | 0.07 |
| | Two-tensor fit: | | | | |
| $(\lambda_1)_A$ | 2.7 ± 2.1 | 2.2 ± 0.5 | 3.4 ± 2.1 | 2.5 ± 1.9 | 2.2 ± 0.8 |
| $(\lambda_2)_A$ | 0.5 ± 0.5 | 0.3 ± 0.2 | 0.6 ± 0.4 | 0.7 ± 0.5 | 0.4 ± 0.4 |
| $(\lambda_3)_A$ | 0.5 ± 0.5 | 0.3 ± 0.2 | 0.6 ± 0.4 | 0.7 ± 0.5 | 0.4 ± 0.4 |
| $(\lambda_1)_B$ | 2.3 ± 1.1 | 2.2 ± 0.6 | 2.1 ± 1.3 | 2.1 ± 0.6 | 1.4 ± 0.6 |
| $(\lambda_2)_B$ | 0.8 ± 0.4 | 0.8 ± 0.2 | 1.4 ± 0.9 | 1.6 ± 0.6 | 0.5 ± 0.5 |
| $(\lambda_3)_B$ | 0.6 ± 0.4 | 0.6 ± 0.2 | 0.7 ± 0.4 | 0.4 ± 0.2 | 0.3 ± 0.3 |
| $\theta(\epsilon_A \cdot \epsilon_B)$§ | (56 ± 9)° | (89 ± 2)° | (46 ± 19)° | (78 ± 8)° | (54 ± 11)° |
| $(\Delta ADC_{RMS})$‡ | 0.02 | 0.02 | 0.03 | 0.01 | 0.01 |

Eigenvalues are given in units of mm$^2$sec$^{-1}$ × 10$^3$. Reported uncertainty is one standard deviation.
*Eigenvalues were trimmed by 10% above the mean, to remove outliers.
§θ is either the angle between the principle eigenvectors (60×, 90×, compC) or the angle between the principle eigenvector of the prolate and the smallest eigenvector of the oblate (compA, compB).
†$(\Delta ADC_{RMS}) = (ADC_{theory} - ADC_{measured})$RMS
‡$(\Delta ADC_{RMS}) = (ADC_{Camino} - ADC_{measured})$RMS Table 1 summarizes the results between measured, fitted, and theoretical expectations. The top three rows of this table show the eigenvalues and orientation between components targeted during synthesis as a reference. Also shown is the RMS differences between measured ADC values and those expected from theory, amounting to less than 10% of the ADC value averaged over all measurements (<ADC$_i$>). The RMS differences are comparable to the "best-fit" difference after fitting the prolate distribution with the possible exception of compA, suggesting that the theory generally matches the synthesized distributions as well as to be expected from actual data. The bottom of Table 1 gives the results of the Camino two-tensor fitting of all pixels in the ROI. Because a two-tensor fit has more degrees of freedom than a single tensor fit and therefore may incorporate noise into a fit more easily if eigenvalues of the components are of similar size, the performance of Camino was tested using noiseless two-component simulated data corresponding to the theoretical components in Table 1. No differences were found between the Camino fits under noiseless conditions and the characteristics of the two component supplied in the simulation, to the degree of precision reported here. Within the spread of the fit values, no significant differences from theory were found. Differences reported for the compA distribution disgarded a small number of significant outliers that represented dramatic fitting failures (e.g., $\lambda \gtrsim 10\text{-}400 \times 10^{-3}$ mm$^2$ sec$^{-1}$).

Variations of the distributions with SNR are shown in FIG. 9. Measurements demonstrate the "squashing peanut" effect (as generally described in Jones, D., Basser, P. J.: 'Squashing Peanuts and Smashing Pumpkins': How Noise Distorts Diffusion-Weighted MR Data. Magnetic Resonance in Medicine 52 (2004), 979-993). This compares favorably with predictions where simulated noise is added to the high SNR distribution. The RMS ADC differences between the measured synthetic and theoretical distributions were $(\Delta ADC_{RMS})=$ (0.05, 0.11, 0.11, 0.10)$\times 10^{-3}$ mm$^2$ sec$^{-1}$ (reading from left to right) for SNR values of 12.6, 3.9, 3.5, and 3.1, respectively. The black outermost boundaries are the theoretical profiles at high SNR, and the green inner boundaries are the profiles at the given SNR values of 12.6, 3.9, 3.5, and 3.1.

As described herein, the synthesis of DTI datasets from measurements that are recombined into composite k-space data matches theoretical expectations. Multiple examples of synthesized ADC distributions were presented, generally agreeing with predictions. Furthermore, synthesis of data at low SNR generally match previously investigated behavior. However, there was no observation of the noise spectrum in k-space after correction of phase. Although phase errors are a possible disadvantage to this method, the data collected should represent the diffusion behavior of a two-component distribution accurately. One difference between the synthesized dataset and an actual dataset is that values across all of k-space represent the actual data redundantly, while each half of k-space represents one component of the distribution for the synthesized data. If the noise varies strongly from acquisition frame to frame, one component of the synthesized data may be more susceptible to noise than the other. Misalignment of the original prolate structure in the phantom will likely lead to a different composite distribution than expected.

Figure 10:
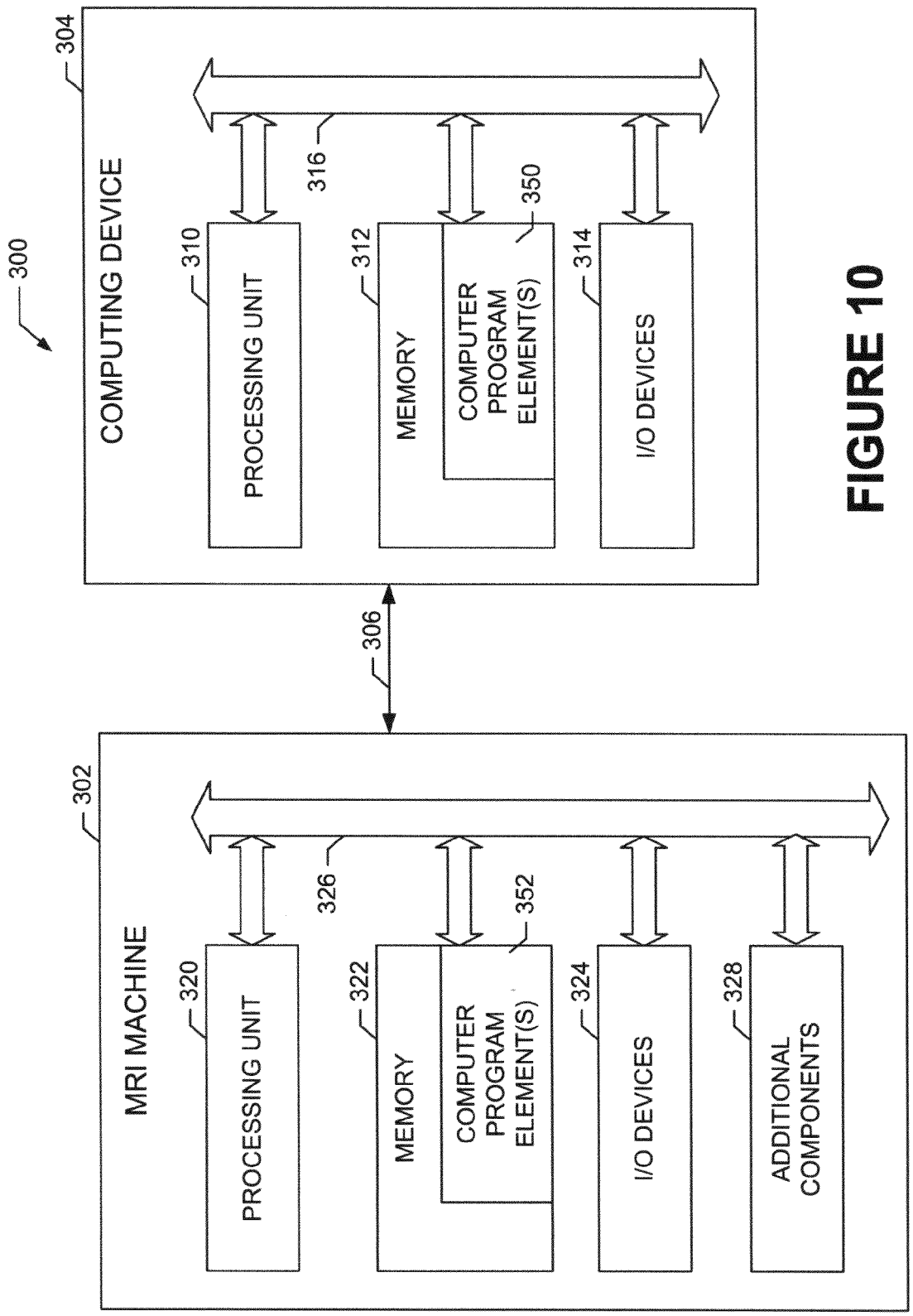
FIG. 10 depicts a block diagram of an example of a suitable computing system environment on which the invention may be implemented.

FIG. 10 depicts a block diagram of an example of a suitable computing system environment 300 on which the invention may be implemented. The computing system environment 300 is only one example of a suitable computing environment and is not intended to suggest any limitation as to the scope of use or functionality of the invention. Neither should the computing environment 300 be interpreted as having any dependency or requirement relating to any one or combination of components illustrated in the exemplary operating environment.

For example, the computing system environment 300 can be implemented on a conventional MRI machine and/or it can be implemented on other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, telephony systems, distributed computing environments that include any of the above systems or devices, and the like.

With reference to FIG. 10, an exemplary system 300 for implementing the invention includes a conventional MRI machine 302 configured for DTI imaging coupled to a general-purpose computing device in the form of a computer 304. The MRI machine 302 can be operatively coupled to the computer via a suitable interface 306, such as a cable or via one or more networks, such as but not limited to: the Internet, a local area network (LAN), a wide area network (WAN), via a telephone line using a modem (POTS), Bluetooth, WiFi, cellular, optical, satellite, RF, Ethernet, magnetic induction, coax, RS-485, or other like networks. In such an embodiment, data obtained from scans by the MRI device 302 can be transmitted to the computer 304 for further manipulation.

Components of the computer 304 may include, but are not limited to, a processing unit 310, a system memory 312, i/o devices 314, and a system bus 316 that couples various system components including the system memory to the processing unit. All of the components of the computer 304 are conventional and well known to those skilled in the art.

For example, the processing unit 310 is a hardware device for executing software that can be stored in memory 312. The processing unit 310 can be virtually any custom made or commercially available processor, a central processing unit (CPU), data signal processor (DSP) or an auxiliary processor among several processors associated with a server, and a semiconductor based microprocessor (in the form of a microchip) or a macroprocessor. Examples of suitable commercially available microprocessors are as follows: an 80×86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 312 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 312 may incorporate electronic, magnetic, optical, and/or other types of storage media. Note that the memory 312 can have a distributed architecture, where various components are situated remote from one another, but can be accessed by the processing unit 310.

Input/output devices 314 can include one or more of the following: a keyboard, a microphone, a pointing device, such as a mouse, trackball or touch pad, a joystick, game pad, satellite dish, scanner, monitor, display device, speaker, printer, or the like.

The system bus 316 can be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Additionally or alternatively, the methods of the present invention can be implemented in a conventional MRI machine having computing components similar to the computer 304, including a processing unit 320, a system memory 322, i/o devices 324, and a system bus 326 that couples various system components including the system memory to the processing unit 320, in addition to the conventional MRI components 328 (such as a coil, magnets, etc.). MRI machines are well known in the art, and thus, the internal components will not be discussed in detail.

The methods of the present invention can be embodied in computer program elements 350, 352. Computer program elements 350, 352 of the invention may be embodied in hardware (such as in the processing unit 320 or memory 322 of the MRI machine 302 or in the processing unit 310 or memory 312 of the computer 304 or computing device operatively connected to an MRI machine) and/or in software (including firmware, resident software, micro-code, etc.). If implemented in hardware, a system of the present invention be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. Computer readable media can be any available media that can be accessed by a computer or computing device and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

While the invention has been described with reference to preferred and example embodiments, it will be understood by those skilled in the art that a variety of modifications, additions and deletions are within the scope of the invention, as defined by the following claims.

What is claimed is:

1. A method for synthesizing crossing ADC distributions via reassembly of multiple k-spaces in an MRI system using a DTI sequence to generate a mean image modeling human or animal tissue, comprising:

scanning with the MRI system a test object having a plurality of anisotropic structures to acquire a first set of DTI data using a plurality of gradient directions;
rotating the gradient directions by an angle $\alpha$;
repeating the step of scanning the test object with the MRI system to acquire a second set of DTI data;
creating a composite data set from the first and second sets of DTI data; and
applying an inverse Fourier transform to the composite data set to generate the mean image.

2. The method of claim 1, wherein the step of creating a composite data set includes combining half of the data from each data set.

3. The method of claim 2, wherein the half of the data of each set comprises data with conjugate complex components removed.

4. The method of claim 2, wherein the plurality of gradient direction is greater than or equal to 12 gradient directions.

5. The method of claim 2, wherein the angle $\alpha$ is between 0° to between 90°.

6. The method of claim 1, further comprising the following steps occurring before creating the composite data set:
performing an inverse Fourier transform to generate the spin density of each set of data;
applying an appropriate phase shift to each set of data; and
transforming each set of data back to k-space.

7. The method of claim 6, further comprising applying smoothing to a phase map before applying the appropriate phase shift to each set of data.

8. The method of claim 6, wherein the step of creating a composite data set includes combining half of the data from each data set.

9. The method of claim 1, further comprising the step of comparing the transformed composite data to a prediction and/or a two-tensor model fit.

10. A non-transitory computer-readable medium storing instructions that, when executed on a programmed processor, carry out a method for synthesizing crossing ADC distributions via reassembly of multiple k-spaces in an MRI system, comprising:
instructions for scanning a test object having a plurality of anisotropic structures to acquire a first set of DTI data using a plurality of gradient directions;
instructions for rotating the gradient directions by an angle $\alpha$;
instructions for repeating the step of scanning the test object to acquire a second set of DTI data;
instructions for creating a composite data set from the first and second sets of data by combining half of the data from each data set; and
instructions for applying an inverse Fourier transform to the composite data set to generate a mean image.

11. The computer-readable medium of claim 10, wherein the plurality of gradient direction is greater than or equal to 12 gradient directions.

12. The computer-readable medium of claim 10, wherein the angle $\alpha$ is between about 0° to between 90°.

13. The computer-readable medium of claim 10, further comprising instructions for:
performing an inverse Fourier transform to generate the spin density of each set of data;
applying an appropriate phase shift to each set of data; and
transforming each set of data back to k-space.

14. The computer-readable medium of claim 13, further comprising instructions for applying smoothing to a phase map before applying the appropriate phase shift to each set of data.

15. The computer-readable medium of claim 10, further comprising instructions for comparing the transformed composite data to a prediction and/or a two-tensor model fit.

16. A system for synthesizing crossing ADC distributions via reassembly of multiple k-spaces in an MRI system using a DTI sequence to generate a mean image modeling human or animal tissue, comprising:
- means for scanning a test object having a plurality of anisotropic structures to acquire a first set of DTI data using a plurality of gradient directions;
- means for rotating the gradient directions by an angle $\alpha$;
- means for repeating the step of scanning the test object to acquire a second set of DTI data;
- means for creating a composite data set from the first and second sets of DTI data by combining half the data from each data set; and
- means for applying an inverse Fourier transform to the composite data set to generate the mean image.

17. The system of claim 16, further comprising means for:
- performing an inverse Fourier transform to generate the spin density of each set of data;
- applying an appropriate phase shift to each set of data; and
- transforming each set of data back to k-space.

18. The system of claim 17, further comprising instructions for applying smoothing to a phase map before applying the appropriate phase shift to each set of data.

19. The system of claim 16, further comprising instructions for comparing the transformed composite data to a prediction and/or a two-tensor model fit.

20. A method for synthesizing crossing ADC distributions via reassembly of multiple k-spaces in an MRI system using a DTI sequence to generate a mean image modeling human or animal tissue, comprising:
- acquiring first and second pluralities of diffusion-weighted images, wherein the first plurality of diffusion-weighted images has a different diffusion weighting than the second plurality of diffusion-weighted images;
- combining half of the diffusion-weighted images of the first plurality with half of the diffusion-weighted images of the second plurality to create a composite data set; and
- applying an inverse Fourier transform to the composite data set to generate the mean image.

21. A method for DTI analysis of tissue of a human or animal subject, comprising:
- scanning a test object having a plurality of anisotropic structures to acquire a first set of apparent diffusion coefficient (ADC) data using a plurality of gradient directions;
- rotating the gradient directions by an angle $\alpha$;
- repeating the step of scanning the test object to acquire a second set of ADC data;
- creating a composite data set from the first and second sets of data;
- applying an inverse Fourier transform to the composite data set to generate a mean image modeling the human or animal tissue;
- scanning tissue of a human or animal subject to acquire a third set of ADC data using the plurality of gradient directions;
- rotating the gradient directions by the angle $\alpha$;
- repeating the step of scanning the tissue to acquire a fourth set of ADC data;
- creating a second composite data set from the third and fourth sets of data;
- applying an inverse Fourier transform to the second composite data set to generate a mean image of the human or animal tissue; and
- comparing the mean image modeling the tissue with the mean image of the actual tissue.

* * * * *